United States Patent [19]

Rybicki et al.

[11] Patent Number: 5,381,112

[45] Date of Patent: Jan. 10, 1995

[54] FULLY DIFFERENTIAL LINE DRIVER CIRCUIT HAVING COMMON-MODE FEEDBACK

[75] Inventors: Mathew A. Rybicki; Todd L. Brooks, both of Austin, Tex.

[73] Assignee: Motorola, Inc., Schaumburg, Ill.

[21] Appl. No.: 124,684

[22] Filed: Sep. 22, 1993

[51] Int. Cl.⁶ .............................................. H03F 3/45
[52] U.S. Cl. .................................. 330/253; 330/258; 330/255
[58] Field of Search ...................... 365/230.06, 189.11, 365/189.09; 307/270; 330/258, 295, 311, 84, 255, 253, 260

[56] References Cited

U.S. PATENT DOCUMENTS

| | | | |
|---|---|---|---|
| 4,794,349 | 12/1988 | Senderowicz et al. | 330/258 |
| 5,083,051 | 1/1992 | Whatley et al. | 307/571 |
| 5,128,630 | 7/1992 | Mijuskovic | 330/258 |
| 5,150,071 | 9/1992 | Bouzidi | 330/84 |
| 5,162,753 | 11/1992 | Khorramabadi | 330/264 |
| 5,172,073 | 12/1992 | Fujii | 330/255 |
| 5,179,354 | 1/1993 | Okamoto | 330/253 |
| 5,225,791 | 7/1993 | Ohta | 330/260 |
| 5,281,924 | 1/1994 | Maloberti et al. | 330/258 |

OTHER PUBLICATIONS

Khorramabadi, "A CMOS Line Driver with 80-dB Linearity for ISDN Applications", IEEE Journal of Solid-State Circuits, vol. 27, No. 4, Apr. 1992, pp. 539–544.

Castello et al., "A High-Linearity 50-Ω CMOS Differential Driver for ISDN Applications", IEEE Journal of Solid-State Circuits, vol. 26, No. 12, Dec. 1991, pp. 1809–1816.

John A. Fisher, "A High-Performance CMOS Power Amplifier", IEEE Journal of Solid-State Circuits, vol. SC-20, No. 6, Dec. 1985, pp. 1200–1205.

Primary Examiner—James B. Mullins
Assistant Examiner—James Dudek
Attorney, Agent, or Firm—Daniel D. Hill

[57] ABSTRACT

A fully differential line driver circuit (25) includes an input differential amplifier (26) and double-ended differential amplifiers (27, 28). A first output driver stage (29) includes a pair of series connected transistors (30, 31), and a second output driver stage includes a pair of series connected transistors (33, 34). The differential amplifiers (27, 28) provide bias and signals voltages to the gates of the series connected transistors (30, 31, 33, 34). The output stages (29, 32) provide differential output signals for driving a low impedance load. The clamping circuits (35-38) control overlap currents in the output stages (29, 32). Common-mode feedback is used to ensure a common-mode voltage of the differential output signals remains at a predetermined voltage to ensure maximum signal swing and thus, maximum efficiency.

20 Claims, 4 Drawing Sheets

FULLY DIFFERENTIAL LINE DRIVER CIRCUIT HAVING COMMON-MODE FEEDBACK

FIELD OF THE INVENTION

This invention relates generally to line driver circuits and more particularly to a fully differential line driver circuit having common-mode feedback.

BACKGROUND OF THE INVENTION

A differential line driver circuit typically receives relatively weak differential input signals and provides differential output signals for driving highly resistive and sometimes highly capacitive loads. Differential line driver circuits are typically used in communications devices to drive transmission lines or telephone cables. Ideally, a differential line driver circuit should provide highly linear operation with low power consumption.

FIG. 1 illustrates in partial schematic diagram form and partial block diagram form, prior art differential line driver circuit 10. Differential line driver circuit 10 includes an input stage comprising differential amplifier 12, a second stage comprising single-ended amplifiers 13–16, and an output stage comprising P-channel transistors 17 and 19 and N-channel transistors 18 and 20. Differential amplifier 12 receives differential input signals, and in response, provides differential output signals to single-ended amplifiers 13–16. The output stage has two portions, each portion comprising a P-channel transistor and an N-channel transistor connected in series between a positive power supply terminal ($V_{DD}$) and a negative power supply terminal ($V_{SS}$).

Input differential amplifier 12 provides a substantial amount of the voltage gain for line driver circuit 10. Single-ended amplifiers 13–16 of the second stage provide level shifting to the output stage and may provide some additional gain. To minimize power consumption, it is desirable to operate single-ended amplifiers 13–16 as class A amplifiers. The function of the output stages is to provide a large current gain for driving a resistive load of between 50 and 100 ohms. Clamping circuits (not shown in FIG. 1) may be used at the gates of the transistors of the output stages to provide a minimum bias current to the transistors of the output stages. The minimum bias current ensures that the output stages Operate in class AB, and improves crossover distortion. Such clamping circuits are well known, and an example clamping circuit is disclosed in U.S. Pat. No. 5,083,051, Whatley et al., "Output Driver Circuit With Improved Output Stage Biasing". In prior art line driver circuit 10 of FIG. 1, if clamping circuits are used on the gates of the output transistors, much of the power consumption occurs as a result of the bias currents of single-ended amplifiers 13–16.

SUMMARY OF THE INVENTION

Accordingly, there is provided, in one form, a line driver circuit, including first and second differential amplifiers, and first and second output stages. The first differential amplifier has first and second input terminals for receiving first and second input signals, and has first and second output terminals for providing first and second intermediate signals. The second differential amplifier has first and second input terminals for receiving the first and second input signals, and has output terminals for providing third and fourth intermediate signals. The first output driver stage has first and second transistors coupled in series for receiving the first intermediate signal and the third intermediate signal. The first output driver stage also provides a first output signal at a first output node between the first and second transistors. The second output driver stage has third and fourth transistors coupled in series for receiving the second intermediate signal and the fourth intermediate signal, and for providing a second output signal at a second output node between the third and fourth transistors. These and other features and advantages will be more clearly understood from the following detailed description taken in conjunction with the accompanying drawings.

DESCRIPTION OF A PREFERRED EMBODIMENT

Figure 2:
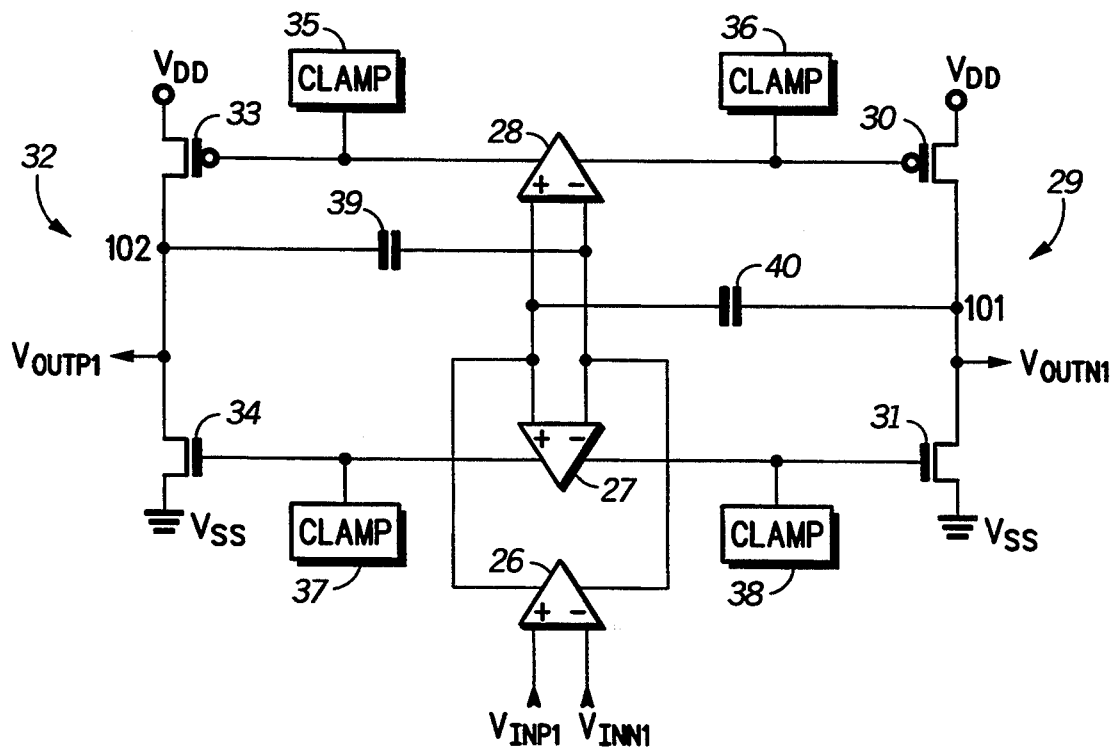
FIG. 2 illustrates in partial schematic diagram form and partial block diagram form, a differential line driver circuit in accordance with the present invention.

FIG. 2 illustrates in partial schematic diagram form and partial block diagram form, differential line driver circuit 25 in accordance with the present invention. Differential line driver circuit 25 is implemented using CMOS technology and includes input differential amplifier 26, differential amplifiers 27 and 28, output stages 29 and 32, clamping circuits 35–38, and compensation capacitors 39 and 40. Output stage 29 includes P-channel transistor 30 and N-channel transistor 31. Output stage 32 includes P-channel transistor 33 and N-channel transistor 34. In the embodiments illustrated in FIG. 2–FIG. 5, like elements are indicated with the same reference numbers.

Input differential amplifier 26 has first and second input terminals for receiving differential input signals labeled "$V_{INP1}$" and "$V_{INN1}$", and first and second output terminals. Differential amplifier 27 has first and second input terminals connected to the first and second output terminals, respectively, of input differential amplifier 26, and first and second output terminals. Differential amplifier 28 has first and second input terminals connected to the first and second output terminals, respectively, of input differential amplifier 26, and first and second output terminals. P-channel transistor 30 has a source connected to a power supply voltage terminal labeled "$V_{DD}$", a gate coupled to the second output terminal of differential amplifier 28, and a drain connected to output node 101 for providing an output signal labeled "$V_{OUTN1}$". N-channel transistor 31 has a drain connected output node 101, a gate connected to the second output terminal of differential amplifier 27, and a source connected to a power supply voltage terminal labeled "$V_{SS}$". P-channel transistor 33 has a source connected to $V_{DD}$, a gate connected to the first output terminal of differential amplifier 28, and a drain connected to output node 102 for providing output signal "$V_{OUTP1}$". N-channel transistor 34 has a drain connected to output node 102, a gate connected to the first output terminal of differential amplifier 27, and a source connected to $V_{SS}$. Clamping circuit 35 is coupled to the gate of P-channel transistor 33. Clamping circuit 36 is coupled to the gate of P-channel transistor 30. Clamping circuit 37 is coupled to the gate of N-channel transistor 34. Clamping circuit 38 is coupled to the gate of N-channel transistor 31. Capacitor 39 has a first plate electrode connected to the second input terminals of differential amplifiers 27 and 28, and a second plate electrode connected to output node 102. Capacitor 40 has a first plate electrode connected to the first input terminals of differential amplifiers 27 and 28, and a second plate electrode connected to output node 101.

Figure 1:
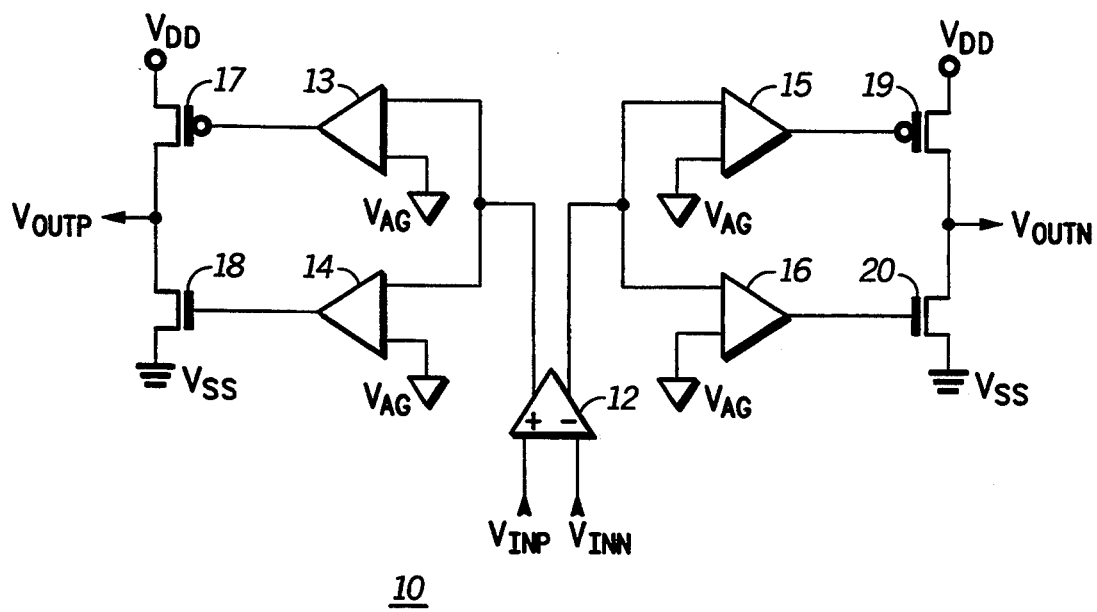
FIG. 1 illustrates in partial schematic diagram form and partial block diagram form, a prior art differential line driver circuit.

Differential line driver circuit 25 functions in a manner similar to that of prior art differential line driver circuit 10. However, unlike prior art differential line driver circuit 10, differential line driver circuit 25 uses only two differential amplifiers having differential output terminals, instead of four differential amplifiers, each having a single output terminal. By using only two differential amplifiers to bias the transistors of output stages 29 and 32, less bias current is used in differential line driver circuit 25, to provide the same level of performance as the prior art circuit of FIG. 1.

Input differential amplifier 26 receives differential input signals $V_{INP1}$ and $V_{INN1}$, and drives the inputs of differential amplifiers 27 and 28. Input differential amplifier 26 provides high gain, and differential amplifiers 27 and 28 provide a level shifting function as well as providing some additional gain. Output stages 29 and 32 provide a large transconductance gain at output nodes 101 and 102 for driving a resistive load of, for example, between about 50 and 100 ohms. Compensation capacitors 39 and 40 provide Miller compensation for frequency stability. Clamping circuits 35-38 are used at the gates of transistors 30 and 31 of output stage 29 and at the gates of transistors 33 and 34 of output stage 32 to provide a minimum bias current in transistors 30, 31, 33, and 34. The minimum bias current ensures that the output stages operate in class AB, thus improving crossover distortion. An example of a clamping circuit used in differential line driver circuit 25 is disclosed in U.S. Pat. No. 5,083,051, Whatley et al., "Output Driver Circuit With Improved Output Stage Biasing".

Unlike prior art line driver circuit 10, differential line driver circuit 25 is fully differential, therefore, common-mode control is necessary. A common-mode feedback circuit is used to provide a common-mode forward gain path in parallel with the differential signal path. Common-mode feedback ensures that the common-mode voltage at output nodes 101 and 102 remains near a predetermined voltage, for example, approximately one-half the power supply potential. Having the common-mode voltage at the predetermined voltage ensures maximum signal swing, and therefore, maximum efficiency. The operation of differential line driver circuit 25 will be explained in more detail in the discussions of FIG. 3–FIG. 5. The common-mode feedback paths are not shown in FIG. 2 and will be explained later in connection with the embodiments of FIG. 3–FIG. 5.

Figure 3:
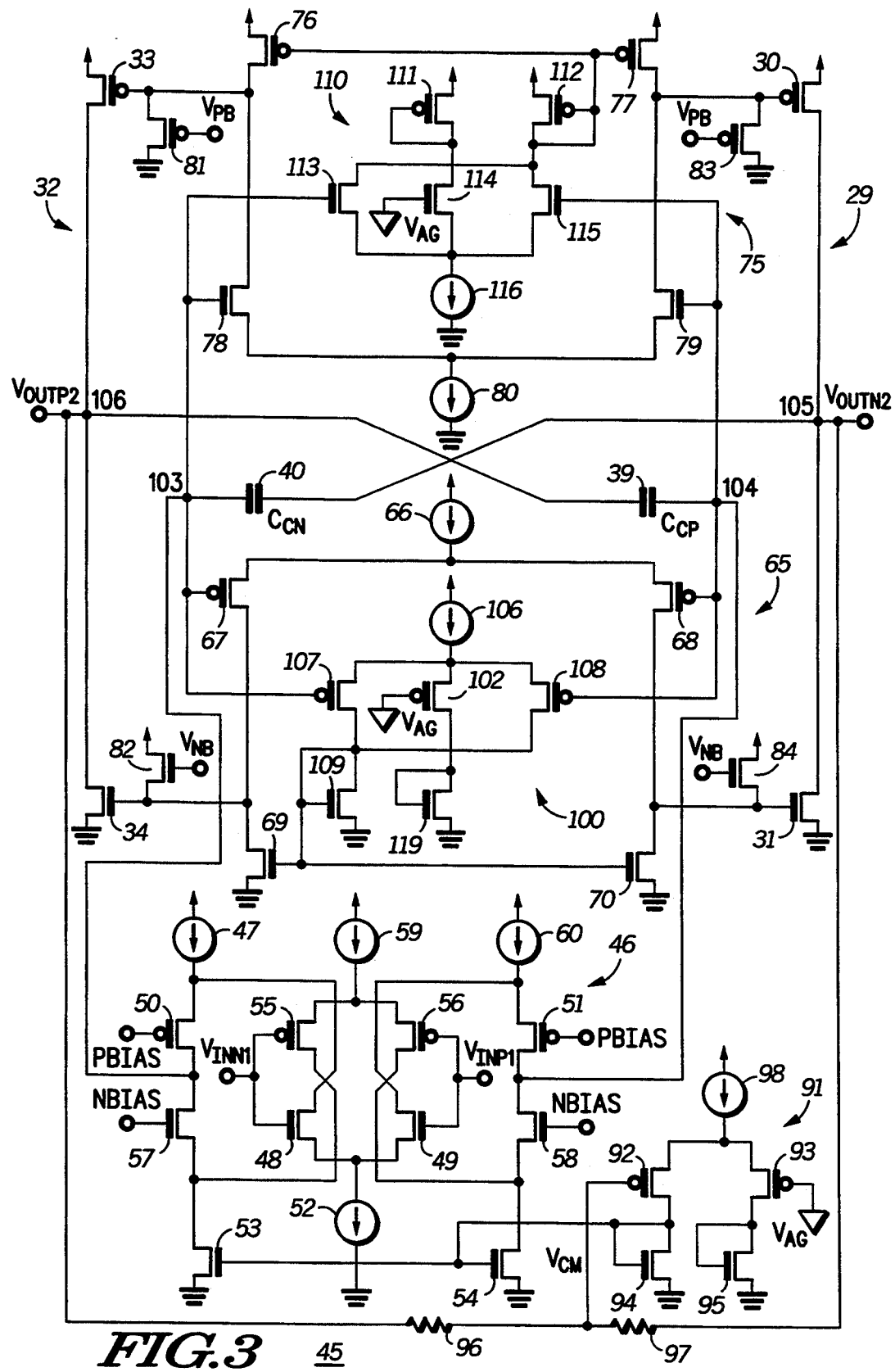
FIG. 3 illustrates in schematic diagram form, one embodiment of the differential line driver circuit of FIG. 2.

FIG. 3 illustrates in schematic diagram form, differential line driver circuit 45 in accordance with one embodiment of the differential line driver circuit 25 of FIG. 2. Differential line driver circuit 45 includes input differential amplifier 46, differential amplifiers 65 and 75, output stages 29 and 32, compensation capacitors 39 and 40, and clamping transistors 81–84. A common-mode feedback circuit is coupled to differential line driver circuit 45 and includes common-mode feedback amplifiers 91, 100, and 110, and resistors 96 and 97.

Input differential amplifier 46 includes P-channel transistors 50, 51, 55, and 56, N-channel transistors 48, 49, 53, 54, 57, and 58, and current sources 47, 52, 59, and 60. Current source 47 has an first terminal connected to $V_{DD}$, and a second terminal. P-channel transistor 50 has a source connected to the second terminal of current source 47, a gate for receiving a bias voltage labeled "$P_{BIAS}$", and a drain connected to node 103. N-channel transistor 57 has a drain connected to the drain of P-channel transistor 50 at node 103, a gate for receiving a bias voltage labeled "$N_{BIAS}$", and a source. N-channel transistor 53 has a drain connected to the source of N-channel transistor 57, a gate, and a source connected to $V_{SS}$. Current source 60 has a first terminal connected to $V_{DD}$, and a second terminal. P-channel transistor 51 has a source connected to the second terminal of current source 60, a gate for receiving bias voltage $P_{BIAS}$, and a drain connected to node 104. N-channel transistor 58 has a drain connected to the drain of P-channel transistor 51 at node 104, a gate for receiving bias voltage $N_{BIAS}$, and a source. N-channel transistor 54 has a drain connected to the source of N-channel transistor 58, a gate connected to the gate of N-channel transistor 53, and a source connected to $V_{SS}$. Current source 59 has a first terminal connected to $V_{DD}$, and a second terminal. P-channel transistor 55 has a source connected to the second terminal of current source 59, a gate for receiving an input signal labeled "$V_{INN1}$", and a drain connected to the drain of N-channel transistor 53. P-channel transistor 56 has a source connected to the second terminal of current source 59, a gate for receiving an input signal labeled "$V_{INP1}$", and a drain connected to drain of N-channel transistor 54. N-channel transistor 48 has a drain connected to the source of P-channel transistor 50, a gate for receiving input signal $V_{INN1}$, and a source. Current source 52 has a first terminal connected to the source of N-channel transistor 48, and a second terminal connected to $V_{SS}$. N-channel transistor 49 has a drain connected to the source of P-channel transistor 51, a gate for receiving input signal $V_{INP1}$, and a source connected to the first terminal of current source 52.

Differential amplifier 65 includes current source 66, P-channel transistors 67 and 68, and N-channel transistors 69 and 70. Current source 66 has a first terminal connected to $V_{DD}$, and a second terminal. P-channel transistor 67 has a source connected to the second terminal of current source 66, a gate connected to the drains of both P-channel transistor 50 and N-channel transistor 57 at node 103, and a drain. N-channel transistor 69 has a drain connected to the drain of P-channel transistor 67, a gate, and a source connected to $V_{SS}$. P-channel transistor 68 has a source connected to the second terminal of current source 66, a gate connected to the drains of both P-channel transistor 51 and N-channel transistor 58 at node 104, and a drain. N-channel transistor 70 has a drain connected to the drain of P-channel transistor 68, a gate connected to the gate of N-channel transistor 69, and a source connected to $V_{SS}$.

Differential amplifier 75 includes P-channel transistors 76 and 77, N-channel transistors 78 and 79, and current source 80. P-channel transistor 76 has a source connected to $V_{DD}$, a gate, and a drain. N-channel transistor 78 has a drain connected to the drain of P-channel transistor 76, a gate connected to the drains of both P-channel transistor 50 and N-channel transistor 57 at node 103, and a source. Current source 80 has a first terminal connected to the source of N-channel transistor 78, and a second terminal connected to $V_{SS}$. P-channel transistor 77 has a source connected to $V_{DD}$, a gate connected to the gate of P-channel transistor 76, and a drain. N-channel transistor 79 has a drain connected to the drain of P-channel transistor 77, a gate connected to the drains of both P-channel transistor 51 and N-channel transistor 58 at node 104, and a source connected to the first terminal of current source 80.

Output stage 29 includes P-channel transistor 30 and N-channel transistor 31. P-channel transistor 30 has a source connected to $V_{DD}$, a gate connected to the drain of P-channel transistor 77, and a drain for provided an output signal labeled "$V_{OUTN2}$". N-channel transistor 31 has a drain connected to the drain of P-channel transistor 30, a gate connected to the drain of P-channel transistor 68, and a source connected to $V_{SS}$. Output stage 32 includes P-channel transistor 33 and N-channel transistor 34. P-channel transistor 33 has a source connected to $V_{DD}$, a gate connected to the drain of P-channel transistor 76, and a drain for providing an output signal labeled "$V_{OUTP2}$". N-channel transistor 34 has a drain connected to the drain of P-channel transistor 33, a gate connected to the drain of P-channel transistor 67, and a source connected to $V_{SS}$.

Clamping transistor 81 has a source connected to the gate of P-channel transistor 33, a gate for receiving a bias voltage labeled "$V_{PB}$", and a drain connected to $V_{SS}$. Clamping transistor 82 has a drain connected to $V_{DD}$, a gate for receiving a bias voltage labeled "$V_{NB}$", and a source connected to the gate of N-channel transistor 34. Clamping transistor 83 has a source connected to the gate of P-channel transistor 30, a gate for receiving bias voltage $V_{PB}$, and a drain connected to $V_{SS}$. Clamping transistor 84 has a drain connected to $V_{DD}$, a gate for receiving bias voltage $V_{NB}$, and a source connected to the gate of N-channel transistor 31.

Compensation capacitor 39 has a first plate electrode connected to the gates of transistors 79 and 68, and a second plate electrode connected to the drains of transistors 33 and 34. Compensation capacitor 40 has a first plate electrode connected to the gates of transistors 78 and 67, and a second plate electrode connected to the drains of transistors 30 and 31.

Resistors 96 and 97 function as a voltage divider for the common-mode feedback circuit. Resistor 96 has a first terminal connected to the drain of P-channel transistor 33, and a second terminal for providing a common-mode voltage labeled "$V_{CM}$". Resistor 97 of the common-mode feedback circuit has a first terminal connected to the drain of P-channel transistor 30, and a second terminal connected to the second terminal of resistor 96.

Common-mode feedback amplifier 91 includes P-channel transistors 92 and 93, N-channel transistors 94 and 95, and current source 98. Current source 98 has a first terminal connected to $V_{DD}$, and a second terminal. P-channel transistor 92 has a source connected to the second terminal of current source 98, a gate connected to the second terminals of resistors 96 and 97, and a drain connected to the gates of N-channel transistors 53 and 54. P-channel transistor 93 has a source connected to the second terminal of current source 98, a gate connected to an analog ground labeled "$V_{AG}$", and a drain. Diode-connected N-channel transistor 94 has both a gate and a drain connected to the drain of P-channel transistor 92, and a source connected to $V_{SS}$. Diode-connected N-channel transistor 95 has both a gate and a drain connected to the drain of P-channel transistor 93, and a source connected to $V_{SS}$.

Common-mode feedback amplifier 100 includes current source 106, P-channel transistors 102, 107, and 108, and N-channel transistors 109 and 119. Current source 106 has a first terminal connected to $V_{DD}$, and a second terminal. P-channel transistor 107 has a source connected to the second terminal of current source 106, a gate connected to the drain of P-channel transistor 50 at node 103, and a drain connected to the gates of both of N-channel transistors 69 and 70. N-channel transistor 109 has a gate and a drain connected to the drain of P-channel transistor 107, and a source connected to $V_{SS}$. P-channel transistor 102 has a source connected to the second terminal of current source 106, a gate connected to $V_{AG}$, and a drain. N-channel transistor 119 has a gate and a drain connected to the drain of P-channel transistor 102, and a source connected to $V_{SS}$. P-channel transistor 108 has a source connected to the second terminal of current source 106, a gate connected to the drain of P-channel transistor 51 at node 104, and a drain connected to the drain of P-channel transistor 109.

Common-mode feedback amplifier 110 includes P-channel transistor 111 and 112, N-channel transistors 113, 114, and 115, and current source 116. Diode-connected P-channel transistor 111 has a source connected to $V_{DD}$, and a gate and a drain connected together. Diode-connected P-channel transistor 112 has a source connected to $V_{DD}$, and a gate and a drain connected to the gate of P-channel transistor 77. N-channel transistor 113 has a drain connected to the drain of P-channel transistor 112, a gate connected to the drain of P-channel transistor 50, and a source. Current source 116 has a first terminal connected to the source of N-channel transistor 113, and a second terminal connected to $V_{SS}$. N-channel transistor 114 has a drain connected to the drain of P-channel transistor 111, a gate connected to $V_{AG}$, and a source connected to the first terminal of current source 116. N-channel transistor 115 has a drain connected to the drain of P-channel transistor 112, a gate connected to the drain of P-channel transistor 51, and a source connected to the first terminal of current source 116.

Input differential amplifier 46 serves as a single stage, high gain input stage for differential line driver circuit 45, and includes two differential pairs coupled to high impedance nodes 103 and 104. One differential pair is formed by P-channel transistors 55 and 56, and current source 59. The other differential pair is formed by N-channel transistors 48 and 49, and current sources 52. Input signals $V_{INN}$ and $V_{INP}$ are differential input signals. P-channel transistors 50 and 51, and N-channel transistors 57 and 58 couple the two input differential pairs to nodes 103 and 104. Nodes 103 and 104 are high impedance nodes, where a small change in current produces a large change in voltage. Common-mode feedback is used to provided a regulated common-mode level in differential line driver circuit 45.

A common-mode feedback circuit from output nodes 105 and 106 to input differential amplifier 46 ensures that the intermediate differential signals of input differential amplifier 46 are superimposed on a predetermined common-mode voltage. The predetermined common-mode voltage is determined by a reference voltage provided at analog ground terminal $V_{AG}$. In a preferred embodiment, the predetermined common-mode voltage is approximately one-half the power supply voltage. In differential line driver circuit 45, a common-mode feedback path is established from output nodes 105 and 106 to control the common-mode voltages of input differential amplifier 46, differential amplifiers 65 and 75, and of output stages 29 and 32. Note that in general, a common-mode voltage for differential signals is defined as the average value of the differential signals.

Resistors 96 and 97 form a voltage divider circuit between output nodes 105 and 106 for determining a common-mode voltage $V_{CM}$ of differential output signals $V_{OUTP2}$ and $V_{OUTN2}$ at nodes 105 and 106. Common-mode voltage $V_{CM}$ is equal to the average value of output signals $V_{OUTP2}$ and $V_{OUTN2}$ at nodes 105 and 106, and is provided to the gate of P-channel transistor 92 of common-mode feedback amplifier 91. Differential amplifier 91 compares the common-mode voltage at the gate of P-channel transistor 92 to reference voltage $V_{AG}$ and provides a bias voltage to the gates of N-channel transistors 53 and 54 that is proportional to the difference between the common-mode voltage $V_{CM}$ and reference voltage $V_{AG}$. Likewise, common-mode feedback amplifiers 100 and 110 sense and compare the common-mode voltage at nodes 103 and 104 to reference voltage $V_{AG}$, and control the bias voltages at the gates of transistors 69 and 70 of differential amplifier 65, and the gates of transistors 76 and 77 of differential amplifier 75.

During the operation of differential line driver circuit 45, if common-mode voltage $V_{CM}$ at the gate of P-channel transistor 92 drops lower than reference voltage $V_{AG}$, P-channel transistor 92 is more conductive than P-channel transistor 93, and more current is steered through P-channel transistor 92 from current source 98. A bias voltage provided to the gates of N-channel transistors 53 and 54 is increased, causing N-channel transistors 53 and 54 to be relatively more conductive. The common-mode voltage of the intermediate differential signals provided at nodes 103 and 104 is decreased. P-channel transistors 107 and 108 of common-mode feedback amplifier 100 senses the decreased common-mode voltage at nodes 103 and 104, and compares the common-mode voltage at nodes 103 and 104 to reference voltage $V_{AG}$ provided to P-channel transistor 102. The decreased common-mode voltage causes less current to be steered through P-channel transistor 102, and more current to be steered through the combination of P-channel transistors 107 and 108, which results in an increased bias voltage being provided to the gates of N-channel transistors 69 and 70, thus causing N-channel transistors 69 and 70 to be more conductive. A common-mode voltage provided to the gates of N-channel transistors 31 and 34 is thus reduced, causing N-channel transistors 31 and 34 to be less conductive. At the same time, the decreased intermediate differential signals at nodes 103 and 104 are provided to the gates of N-channel transistors 113 and 115. N-channel transistors 113 and 115 sense the increased common-mode voltage of nodes 103 and 104, and compare the increased common-mode voltage to reference voltage $V_{AG}$. In this case, N-channel transistor 114 would be more conductive than the combination of N-channel transistors 113 and 115, relatively more current is steered through N-channel transistor 114, and less current to be steered through the combination of N-channel transistors 113 and 115, which results in an increased bias voltage being provided to the gates of P-channel transistors 76 and 77, and causing P-channel transistors 76 and 77 to be less conductive. A common-mode voltage provided to the gates of P-channel transistors 30 and 33 is thus reduced, causing P-channel transistors 30 and 33 to be more conductive. When P-channel transistors 30 and 33 are more conductive and N-channel transistors 31 and 34 are less conductive, the common-mode voltage of differential output signals $V_{OUTP2}$ and $V_{OUTN2}$ is increased toward the predetermined common-mode voltage determined by reference voltage $V_{AG}$.

For the case in which the common-mode voltage of differential output signals $V_{OUTP2}$ and $V_{OUTN2}$ increases above reference voltage $V_{AG}$, common-mode voltage $V_{CM}$ increases, P-channel transistor 92 becomes less conductive than P-channel transistor 93 and less current is steered through P-channel transistor 92. The voltage provided to the gates of N-channel transistors 53 and 54 is decreased, thus causing N-channel transistors 53 and 54 to be less conductive, and increasing the common-mode voltage of the intermediate differential signals provided at nodes 103 and 104. P-channel transistors 107 and 108 of common-mode feedback amplifier 100 senses the increased common-mode voltage at nodes 103 and 104, and compares the increased common-mode voltage at nodes 103 and 104 to reference voltage $V_{AG}$ provided to P-channel transistor 102. The increased common-mode voltage causes more current to be steered through P-channel transistor 102, and less current through the combination of P-channel transistors 107 and 108, which results in a reduced bias voltage being provided to the gates of N-channel transistors 69 and 70 causing N-channel transistors 69 and 70 to be less conductive. A common-mode voltage provided to the gates of N-channel transistors 31 and 34 is increased, thus causing N-channel transistors 31 and 34 to be more conductive. At the same time, the increased intermediate differential signals at nodes 103 and 104 are provided to the gates of N-channel transistors 113 and 115. N-channel transistors 113 and 115 sense the increased common-mode voltage of nodes 103 and 104, and compare the increased common-mode voltage to analog ground $V_{AG}$. In this case, N-channel transistor 114 would be less conductive than the combination of N-channel transistors 113 and 115, relatively less current is steered through N-channel transistor 114, and more current is steered through the combination of N-channel transistors 113 and 115, causing a common-mode voltage provided to the gates of P-channel transistors 76 and 77 to be decreased. Thus, P-channel transistors 76 and 77 become more conductive, increasing the bias voltage provided to the gates of P-channel transistors 30 and 33, causing P-channel transistors 30 and 33 to be less conductive. When P-channel transistors 30 and 33 are less conductive and N-channel transistors 31 and 34 are more conductive, the common-mode voltage of differential output signals $V_{OUTP2}$ and $V_{OUTN2}$ is decreased in a direction toward the predetermined common-mode voltage determined by reference voltage $V_{AG}$.

Clamping transistors 81–84 provide control over a predetermined minimum gate-source voltage ($V_{GS}$) of transistors 33, 34, 30, and 31, respectively, in order to control the minimum currents in output stages 29 and 32. Bias voltages $V_{PB}$ and $V_{NB}$ determine the minimum $V_{GS}$ of transistors 33, 34, 30, and 31. An example clamping circuit is disclosed in U.S. Pat. No. 5,083,051, "Output Driver Circuit With Improved Output Stage Biasing", Whatley et al.

An increase in the cross-over voltage of a differential amplifier may occur when transistor sizes in the differential amplifier are skewed. Skewed transistor sizes may occur because of process variations. Differential amplifiers 65 and 75 are used to minimize the effect of offset, and to ensure that there is not a large overlap current in output stages 29 and 32. Differential amplifiers 65 and 75 provide level-shifted bias voltages to output stages 29 and 32 with relatively low gain and relatively few offset enhancing devices in the signal path.

Figure 4:
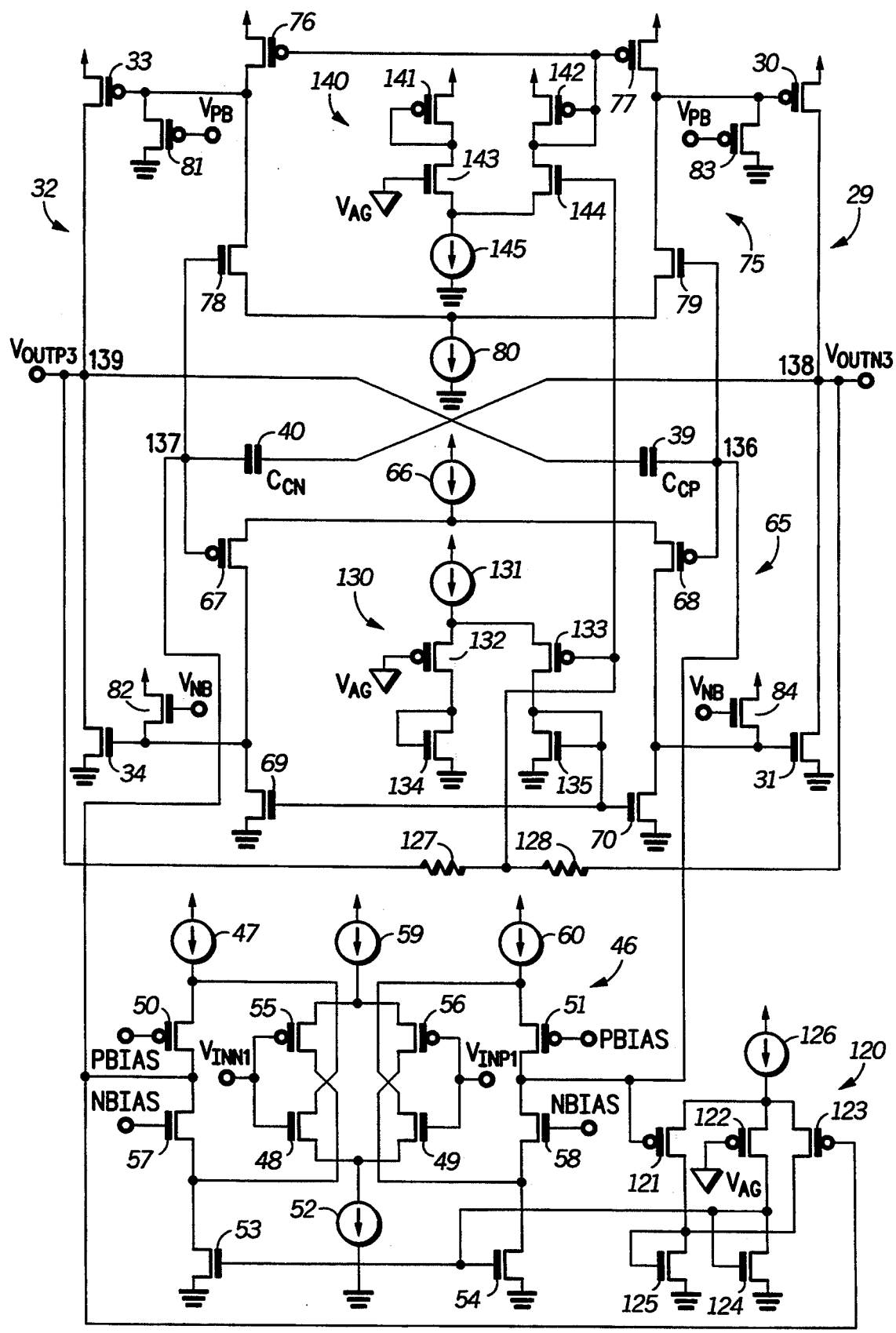
FIG. 4 illustrates in schematic diagram form, another embodiment of the differential line driver circuit of FIG. 2.

FIG. 4 illustrates in schematic diagram form, differential line driver circuit 90 in accordance with another embodiment of the differential line driver circuit 25 of FIG. 2. Differential line driver circuit 90 functions in a manner similar to differential line driver circuit 45 of FIG. 3. The difference between differential line driver circuit 90 and differential line driver circuit 45 is in the way common-mode feedback is used. In differential line driver circuit 90, local common-mode feedback loops are used instead of one common-mode feedback loop illustrated in FIG. 3. One of the local common-mode feedback loops includes common-mode feedback amplifiers 130 and 140, and provides common-mode feedback for differential amplifiers 65 and 75, respectively, of FIG. 4. Another common-mode feedback loop includes common-mode feedback amplifier 120, and provides common-mode feedback for input differential amplifier 46 of FIG. 4.

In the first local common-mode feedback loop, resistors 127 and 128 form a voltage divider to measure an average, or common-mode voltage of differential output signals $V_{OUTP3}$ and $V_{OUTN3}$, and provides the common-mode voltage to common-mode feedback amplifiers 130 and 140. Common-mode feedback amplifiers 130 and 140 both have a structure similar to common-mode feedback amplifier 91 of FIG. 3. Reference voltage $V_{AG}$ is provided at approximately one-half the power supply voltage and is utilized as a reference voltage for common-mode feedback amplifiers 120, 130, and 140.

The voltage divider circuit formed by resistors 127 and 128 provides the common-mode voltage of differential output signals $V_{OUTP3}$ and $V_{OUTN3}$ at nodes 139 and 138, respectively, to the gate of P-channel transistor 133 of common-mode feedback amplifier 130 and to N-channel transistor 144 of common-mode feedback amplifier 140. Differential amplifiers 130 and 140 compare the common-mode voltage to reference voltage $V_{AG}$ and provide a bias voltage to differential amplifiers 65 and 75, respectively, that is proportional to the difference between the common-mode voltage and reference voltage $V_{AG}$.

During the operation of differential line driver circuit 90, if the common-mode voltage of the intermediate differential signals at nodes 136 and 137 drops lower than reference voltage $V_{AG}$, P-channel transistor 122 is less conductive than the combination of P-channel transistors 121 and 123, less current is steered through P-channel transistor 122 from current source 126. The voltage provided to the gates of N-channel transistors 53 and 54 is reduced, causing N-channel transistors 53 and 54 to be relatively less conductive, which causes the common-mode voltage of input differential amplifier 46 to rise, and thus return to the predetermined common-mode voltage set by reference voltage $V_{AG}$. At the same time, the voltage divider comprising resistors 127 and 128 senses the common-mode voltage of differential output signals $V_{OUTP3}$ and $V_{OUTN3}$ provided at nodes 139 and 138, respectively. If the common-mode voltage of differential output signals $V_{OUTP3}$ and $V_{OUTN3}$ decreases below the predetermined common-mode voltage determined by analog ground $V_{AG}$, a decreased bias voltage is provided to the gate P-channel transistor 133 and to the gate of N-channel transistor 144. P-channel transistor 133 becomes more conductive, causing more current to be steered through P-channel transistor 133 from current source 131. The bias voltage at the gates of N-channel transistors 69 and 70 is increased, causing N-channel transistors 69 and 70 to be more conductive, resulting in the bias voltage at the gates of N-channel transistors 31 and 34 being decreased. Likewise, N-channel transistor 144 becomes less conductive, causing the voltage at the gates of P-channel transistors 76 and 77 being increased, resulting in P-channel transistors 76 and 77 being less conductive. The voltage at the gates of P-channel transistors 30 and 33 is reduced, which causes P-channel transistors 30 and 33 to be more conductive. When P-channel transistors 30 and 33 are more conductive, and N-channel transistors 31 and 34 are less conductive, the common-mode voltage of the differential output signals increase.

The embodiments of FIG. 3 and FIG. 4 have some advantages and disadvantages as compared to each other. In differential line driver circuit 45 of FIG. 3, a higher common-mode gain is achieved because the resulting gain is a product of the gain of input differential amplifier 46, differential amplifiers 65 and 75, and output stages 29 and 32. However, stability may be reduced because of the additional gain stages. In differential line driver circuit 90, better stability is achieved at the expense of reduced common-mode gain because there are fewer gain stages in the local common-mode feedback loops. High common-mode gain provides better regulation of common-mode level, which allows greater voltage swing at output nodes 105 and 106.

Figure 5:
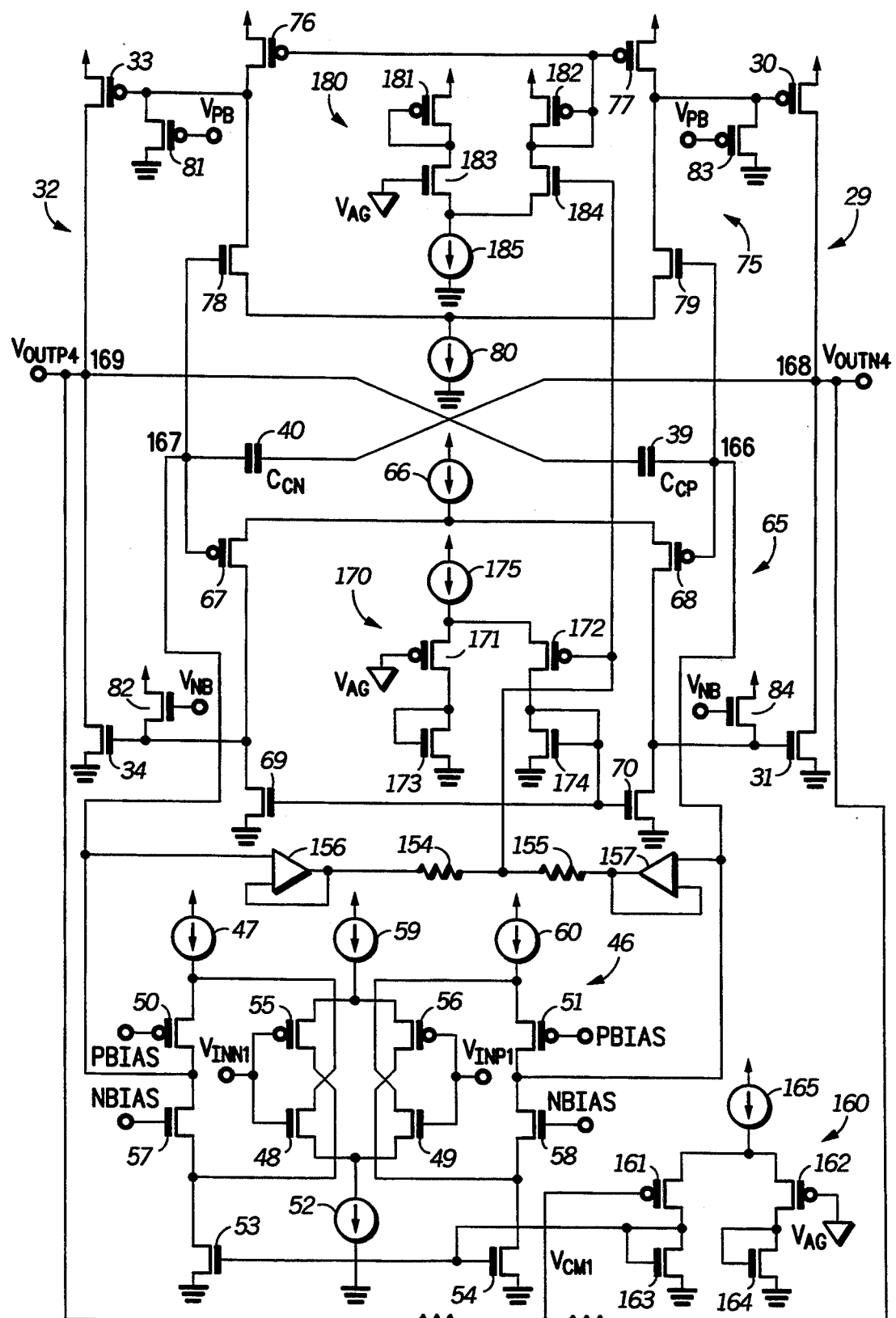
FIG. 5 illustrates in schematic diagram form, another embodiment of the differential line driver circuit of FIG. 2.

FIG. 5 illustrates in schematic diagram form, differential line driver circuit 150 in accordance with another embodiment of differential line driver circuit 25 of FIG. 2. Differential line driver circuit 150 includes resistors 151, 152, 154, and 155, buffers 156 and 157, and common-mode feedback amplifiers 160, 170, and 180.

Differential line driver circuit 150 functions in a manner similar to differential line driver circuit 45 of FIG. 3 and differential line driver circuit 90 of FIG. 4. The difference between differential line driver circuit 150 and the embodiment of FIG. 3 is in the way in which common-mode feedback is provided. In differential line driver circuit 150, a voltage divider comprising resistors 151 and 152 sense an average, or common-mode voltage $V_{CM1}$ of differential output signals $V_{OUTP4}$ and $V_{OUTN4}$ at nodes 169 and 168, respectively. Common-mode feedback amplifier 160 is similar to common-mode amplifier 91 of FIG. 3, and compares common-mode voltage $V_{CM1}$ to analog ground $V_{AG}$. In addition, a voltage divider comprising resistors 154 and 155 senses the common-mode voltage of intermediate differential signals at nodes 166 and 167. Buffers 156 and 157 are used to ensure that nodes 166 and 167 remain at a high impedance to maximize voltage gain from input differential amplifier 46. Switched capacitors could be used instead of buffers 156 and 157. Common-mode feedback amplifiers 170 and 180 are similar to common-mode amplifiers 130 and 140, respectively, of FIG. 4. Common-mode feedback amplifiers 170 and 180 compare the common-mode voltage at nodes 166 and 167 to analog ground $V_{AG}$, and control the voltage level of the common-mode voltage of differential output signals $V_{OUTP4}$ and $V_{OUTN4}$ at nodes 168 and 169 in response.

In operation, the voltage divider comprising resistors 151 and 152 provides common-mode voltage $V_{CM1}$ to the gate of P-channel transistor 161. If common-mode voltage $V_{CM1}$ is greater than analog ground $V_{AG}$, more current is steered through the leg comprising transistors 162 and 164 than through the leg comprising transistors 161 and 163. A bias voltage provided to the gates of N-channel transistors 53 and 54 is reduced, causing the common-mode voltage of the intermediate differential signals at nodes 166 and 167 to increase. The increased common-mode voltage of the intermediate differential signals is detected by the voltage divider comprising resistors 154 and 155, and is provided to the gate of P-channel transistor 172 and to the gate of N-channel transistor 184. More current is steered through P-channel transistor 171 from current source 175, and less current is steered through P-channel transistor 172. A bias voltage provided to the gates of N-channel transistors 69 and 70 is reduced, causing a common-mode voltage provided to the gates of N-channel transistors 31 and 34 to increase, resulting in N-channel transistors 31 and 34 to become more conductive. At the same time, in common-mode feedback amplifier 180, N-channel transistor 184 is more conductive than N-channel transistor 183, thus more current is steered through N-channel transistor 184 causing a bias voltage provided to the gates of P-channel transistors 76 and 77 to be reduced. P-channel transistors 76 and 77 are more conductive, which raises the common-mode voltage provided to P-channel transistors 30 and 33, thus causing P-channel transistors 30 and 33 to be less conductive. Therefore, since P-channel transistors 30 and 33 are less conductive and N-channel transistors 31 and 34 are more conductive, the common-mode voltage of differential output signals $V_{OUTP4}$ and $V_{OUTN4}$ is reduced.

If common-mode voltage $V_{CM1}$ is less than analog ground $V_{AG}$, less current is steered through the leg comprising transistors 162 and 164 than through the leg comprising transistors 161 and 163. A bias voltage provided to the gates of N-channel transistors 53 and 54 is increased, causing the common-mode voltage of the intermediate differential signals at nodes 166 and 167 to decrease. The decreased common-mode voltage of the intermediate differential signals is detected by the voltage divider comprising resistors 154 and 155, and is provided to the gate of P-channel transistor 172 and to the gate of N-channel transistor 184. Less current is steered through P-channel transistor 171 from current source 175, and more current is steered through P-channel transistor 172. A bias voltage provided to the gates of N-channel transistors 69 and 70 is increased, causing a common-mode voltage provided to the gates of N-channel transistors 31 and 34 to decrease, resulting in N-channel transistors 31 and 34 becoming less conductive. At the same time, in common-mode feedback amplifier 180, N-channel transistor 184 is relatively less conductive than N-channel transistor 183, thus less current is steered through N-channel transistor 184 causing a bias voltage provided to the gates of P-channel transistors 76 and 77 to be increased. P-channel transistors 76 and 77 are relatively less conductive, which reduces the common-mode voltage provided to P-channel transistors 30 and 33, thus causing P-channel transistors 30 and 33 to be more conductive. Therefore, since P-channel transistors 30 and 33 are more conductive and N-channel transistors 31 and 34 are less conductive, the common-mode voltage of differential output signals $V_{OUTP4}$ and $V_{OUTN4}$ is increased.

By using only two differential amplifiers to bias the transistors of output stages 29 and 30, there are less bias currents and thus less power consumption in differential line driver circuit 25 (FIG. 2) than in prior art line driver circuit 10. Since line driver circuit 25 is fully differential, common-mode control is required. The common-mode feedback loops illustrated in FIG. 3–FIG. 5 provide precise common-mode feedback control in order in ensure that the common-mode remains at one-half the power supply voltage, thus ensuring maximum signal swing and maximum efficiency.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A line driver circuit, comprising:
   a first differential amplifier having first and second input terminals for receiving first and second input signals, and having first and second output terminals for providing first and second intermediate signals;
   a first common-mode control circuit having first and second input terminals coupled to the first and second input terminals of the first differential amplifier, respectively, for sensing a common-mode voltage of the first and second input signals, and controlling a common-mode voltage of the first and second intermediate signals;
   a second differential amplifier having first and second input terminals for receiving the first and second input signals, and having first and second output terminals for providing third and fourth intermediate signals;
   a second common-mode control circuit having first and second input terminals coupled to the first and second input terminals of the second differential amplifier, respectively, for sensing the common-mode voltage of the first and second input signals, and controlling a common-mode voltage of the third and fourth intermediate signals;
   a first output driver stage having first and second transistors coupled in series for receiving the first intermediate signal and the third intermediate signal, and for providing a first output signal at a first output node between the first and second transistors; and
   a second output driver stage having third and fourth transistors coupled in series for receiving the second intermediate signal and the fourth intermediate signal, and for providing a second output signal at a second output node between the third and fourth transistors.

2. The line driver circuit of claim 1, further comprising:
   a first clamping circuit, coupled to the first output driver stage, for controlling an overlap current in the first and second transistors when the first and second output signals are in a cross-over region; and a second clamping circuit, coupled to the second output driver stage, for controlling an overlap current in the third and fourth transistors when the first and second output signals are in the cross-over region.

3. The line driver circuit of claim 1, wherein the first and second output signals are characterized as being differential output signals.

4. The line driver circuit of claim 3, further comprising an input differential amplifier having first and second input terminals for receiving differential input signals, and first and second output terminals coupled to the input terminals of the first and second differential amplifiers, for providing the first and second input signals.

5. The line driver circuit of claim 4, further comprising a common mode feedback circuit, coupled to the input differential amplifier and to the first and second output nodes, for sensing a common-mode voltage of the first and second output signals and providing a common-mode feedback voltage to ensure that the common-mode voltage of the first and second output signals is provided at a predetermined voltage level.

6. The line driver circuit of claim 5, wherein the common-mode feedback circuit further comprises a voltage divider circuit for sensing the common-mode voltage of the first and second output signals.

7. The line driver circuit of claim 5, wherein the common-mode feedback circuit comprises:
a first common-mode feedback circuit for sensing the common-mode voltage of the first and second output signals, and providing a first common-mode feedback voltage to ensure that a common-mode voltage of the first and second input signals is provided at a predetermined voltage level; and
a second common-mode feedback circuit for sensing a common-mode voltage of the first and second input signals and providing a second common-mode feedback voltage to ensure that a common-mode voltage of the first and second output signals are provided at the predetermined voltage level.

8. The line driver circuit of claim 7, wherein the predetermined voltage level is equal to substantially one-half of a power supply voltage.

9. The line driver circuit of claim 1, further comprising:
a first compensation capacitor having a first plate electrode coupled to the first input terminals of the first and second differential amplifiers, and a second plate electrode coupled to the first output node; and
a second compensation capacitor having a first plate electrode coupled to the second input terminals of the first and second differential amplifiers, and a second plate electrode coupled to the second output node.

10. A CMOS differential line driver circuit, comprising:
an input differential amplifier having first and second input terminals for receiving differential input signals, and first and second output terminals for providing first and second intermediate differential signals;
a first differential amplifier having first and second input terminals coupled to the first and second output terminals of the input differential amplifier, and having first and second output terminals for providing third and fourth intermediate signals;
a first common-mode control circuit having first and second input terminals coupled to the first and second input terminals of the first differential amplifier, respectively, for sensing a common-mode voltage of the first and second intermediate signals, and controlling a common-mode voltage of the third and fourth intermediate signals;
a second differential amplifier having first and second input terminals coupled to the first and second output terminals of the input differential amplifier, and having output terminals for providing fifth and sixth intermediate signals;
a second common-mode control circuit having first and second input terminals coupled to the first and second input terminals of the second differential amplifier, respectively, for sensing the common-mode voltage of the first and second intermediate Signals, and controlling a common-mode voltage of the fifth and sixth intermediate signals;
a first output driver stage having first and second transistors coupled in series for receiving the third intermediate signal and the fifth intermediate signal, and for providing a first output signal at a first output node between the first and second transistors;
a second output driver stage having third and fourth transistors coupled in series for receiving the fourth intermediate signal and the sixth intermediate signal, and for providing a second output signal at a second output node between the third and fourth transistors; and
a common-mode feedback circuit, coupled to the first and second output nodes and to the input differential amplifier, for sensing a common-mode voltage of the first and second output signals, and providing a common-mode feedback voltage to control the common-mode voltage of the first and second intermediate signals.

11. The line driver circuit of claim 10, wherein the common-mode feedback circuit comprises:
a voltage divider circuit for sensing the common-mode voltage of the first and second output signals; and
a third differential amplifier for comparing the common-mode feedback voltage to a reference voltage.

12. The line driver circuit of claim 10, further comprising:
a first compensation capacitor having a first plate electrode coupled to the first input terminals of the first and second differential amplifiers, and a second plate electrode coupled to the first output node; and
a second compensation capacitor having a first plate electrode coupled to the second input terminals of the first and second differential amplifiers, and a second plate electrode coupled to the second output node.

13. The line driver circuit of claim 10, further comprising:
a first clamping circuit, coupled to the first output driver stage, for controlling an overlap current in the first and second transistors when the first and second output signals are in a cross-over region; and
a second clamping circuit, coupled to the second output driver stage, for controlling an overlap current in the third and fourth transistors when the first and second output signals are in the cross-over region.

14. A fully differential line driver circuit, comprising:
a high gain input amplifier stage having first and second input terminals for receiving first and second input signals, respectively, and first and second output terminals for providing first and second intermediate differential signals;
a first differential amplifier, comprising:
  a first P-channel transistor having a source connected to a first power supply voltage terminal, a gate, and a drain;
  a second P-channel transistor having a source connected to the first power supply voltage terminal, a gate connected to the gate of the first P-channel transistor, and a drain;
  a first N-channel transistor having a drain connected to the drain of the first P-channel transistor, a gate connected to the first output terminal of the high gain input amplifier stage, and a source;
  a second N-channel transistor having a drain connected to the drain of the second P-channel transistor, a gate connected to the second output terminal of the high gain input amplifier stage, and a source connected to the source of the first N-channel transistor; and
  a first current source having a first terminal connected to the sources of the first and second N-channel transistors, and a second terminal connected to a second power supply voltage terminal;
a second differential amplifier comprising:
  a third N-channel transistor having a source connected to the second power supply voltage terminal, a gate, and a drain;
  a fourth N-channel transistor having a source connected to the second power supply voltage terminal, a gate connected to the gate of the third N-channel transistor, and a drain;
  a third P-channel transistor having a drain connected to the drain of the third N-channel transistor, a gate connected to the first output terminal of the high gain input amplifier stage, and a source;
  a fourth P-channel transistor having a drain connected to the drain of the fourth N-channel transistor, a gate connected to the second output terminal of the high gain input amplifier stage, and a source connected to the source of the third P-channel transistor; and
  a second current source having a first terminal connected to the first power supply voltage terminal, and a second terminal connected to the sources of the third and fourth P-channel transistors;
a first output stage, comprising:
  a fifth P-channel transistor having a source connected to the first power supply voltage terminal, a gate connected to the drain of the first P-channel transistor, and a drain for providing a first output signal; and
  a fifth N-channel transistor having a drain connected to the drain of the fifth P-channel transistor, a gate connected to the drain of the third P-channel transistor, and a source connected to the second power supply voltage terminal; and
a second output stage, comprising:
  a sixth P-channel transistor having a source connected to the first power supply voltage terminal, a gate connected to the drain of the second P-channel transistor, and a drain for providing a second output signal; and
  a sixth N-channel transistor having a drain connected to the drain of the sixth P-channel transistor, a gate connected to the drain of the fourth P-channel transistor, and a source connected to the second power supply voltage terminal.

15. The fully differential line driver circuit of claim 14, wherein the high gain input amplifier stage comprises:
  a third current source having a first terminal connected to the first power supply voltage terminal, and a second terminal;
  a seventh P-channel transistor having a source connected to the second terminal of the third current source, a gate for receiving the first input signal, and a drain;
  an eighth P-channel transistor having a source connected to the second terminal of the third current source, a gate for receiving the second input signal, and a drain;
  a seventh N-channel transistor having a drain connected to the drain of the seventh P-channel transistor, a gate, and a source connected to the second power supply voltage terminal;
  an eighth N-channel transistor having a drain connected to the drain of the eighth P-channel transistor, a gate connected to the gate of the seventh N-channel transistor, and a source connected to the second power supply voltage terminal;
  a fourth current source having a first terminal connected to the second power supply,voltage terminal, and a second terminal;
  a ninth N-channel transistor having a source connected to the second terminal of the fourth current source, a gate for receiving the first input signal, and a drain;
  a tenth N-channel transistor having a source connected to the second terminal of the fourth current source, a gate for receiving the second input signal, and a drain;
  a fifth current source having a first terminal connected to the first power supply voltage terminal, and a second terminal connected to the drain of the ninth N-channel transistor;
  a sixth current source having a first terminal connected to the first power supply voltage terminal, and a second terminal connected to the drain of the tenth N-channel transistor;
  a ninth P-channel transistor having a source connected to the second terminal of the fifth current source, a gate for receiving a first bias voltage, and a drain connected to the gates of both of the first N-channel transistor and the third P-channel transistor;
  a tenth P-channel transistor having a source connected to the second terminal of the sixth current source, a gate for receiving the first bias voltage, and a drain connected to the gates of both of the second N-channel transistor and the fourth P-channel transistor;
  an eleventh N-channel transistor having a drain connected to the drain of the ninth P-channel transistor, a gate for receiving a second bias voltage, and a source connected to the drain of seventh N-channel transistor; and a twelfth N-channel transistor having a drain connected to the drain of the tenth P-channel transistor, a gate for receiving the second bias voltage, and a source connected to the drain of the eighth N-channel transistor.

16. The fully differential line driver circuit of claim 15, further comprising:

a voltage divider circuit having a first terminal connected to the drain of the fifth P-channel transistor, and a second terminal connected to the drain of the sixth P-channel transistor;

a common-mode feedback circuit having a first input terminal connected to the voltage divider circuit, a second input terminal for receiving a reference voltage, and an output terminal connected to the gates of the seventh and eighth N-channel transistors;

a first common-mode control circuit having a first input terminal connected to the gate of the first N-channel transistor, a second input terminal connected to the gate of the second N-channel transistor, and an output terminal connected to the gates of the first and second P-channel transistors; and a second common-mode control circuit having a first input terminal connected to the gate of the third P-channel transistor, a second input terminal connected to the gate of the fourth P-channel transistor, and an output terminal connected to the gates of the third and fourth N-channel transistors.

17. The fully differential line driver circuit of claim 15, further comprising:

a first common-mode feedback circuit having a first input terminal connected to the drain of the tenth P-channel transistor, a second input terminal connected to the drain of the ninth P-channel transistor, and an output terminal connected to the gates of the seventh and eighth N-channel transistors;

a voltage divider circuit having a first terminal connected to the drain of the fifth P-channel transistor, and a second terminal connected to the drain of the sixth P-channel transistor;

a second common-mode feedback circuit having a first input terminal connected to the voltage divider circuit, a second input terminal for receiving a reference voltage, and an output terminal connected to the gates of the first and second P-channel transistors; and a third common-mode feedback circuit having a first input terminal connected to the voltage divider circuit, a second input terminal for receiving the reference voltage, and an output terminal connected to the gates of the third and fourth N-channel transistors.

18. The fully differential line driver circuit of claim 15, further comprising:

a first voltage divider circuit having a first terminal connected to the drain of the fifth P-channel transistor, and a second terminal connected to the drain of the sixth P-channel transistor;

a first common-mode feedback circuit having a first input terminal connected to the first voltage divider circuit, a second input terminal for receiving a reference voltage, and an output terminal connected to the gates of the seventh and eighth N-channel transistors;

a second voltage divider circuit having a first terminal connected to the drain of the ninth P-channel transistor, and a second terminal connected to the drain of the tenth P-channel transistor;

a second common-mode feedback circuit having a first input terminal connected to the second voltage divider circuit, a second input terminal for receiving the reference voltage, and an output terminal connected to the gates of the first and second P-channel transistors; and a third common-mode feedback circuit having a first input terminal connected to the second voltage divider circuit, a second input terminal for receiving the reference voltage, and an output terminal connected to the gates of the third and fourth N-channel transistors.

19. The fully differential line driver circuit of claim 14, further comprising:

a first clamping circuit, coupled to the gate of the fifth P-channel transistor and a second clamping circuit coupled to the gate of the fifth N-channel transistor, for controlling an overlap current in the fifth P-channel transistor and in the fifth N-channel transistor; and a third clamping circuit, coupled to the gate of the sixth P-channel transistor and a fourth clamping circuit coupled to the gate of the sixth N-channel transistor, for controlling an overlap current in the sixth P-channel transistor and in the sixth N-channel transistor.

20. The fully differential line driver circuit of claim 14, further comprising:

a first compensation capacitor having a first plate electrode connected to the gate of the fourth P-channel transistor, and a second plate electrode connected to the drain of the fifth P-channel transistor; and a second compensation capacitor having a first plate electrode connected to the gate of the third P-channel transistor, and a second plate electrode connected to the drain of the sixth P-channel transistor.

* * * * *